United States Patent
Khemka et al.

(10) Patent No.: US 7,141,860 B2
(45) Date of Patent: Nov. 28, 2006

(54) LDMOS TRANSISTOR

(75) Inventors: Vishnu K. Khemka, Phoenix, AZ (US);
Vijay Parthasarathy, Phoenix, AZ (US); Ronghua Zhu, Chandler, AZ (US); Amitava Bose, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/875,105

(22) Filed: Jun. 23, 2004

(65) Prior Publication Data

US 2005/0285188 A1    Dec. 29, 2005

(51) Int. Cl.
*H01L 27/95* (2006.01)
*H01L 29/47* (2006.01)

(52) U.S. Cl. .................. 257/471; 257/476; 257/484

(58) Field of Classification Search ................ 257/328, 257/335, 336, 339, 344, 471, 475, 476, 483, 257/484
See application file for complete search history.

(56) References Cited

U.S. PATENT DOCUMENTS

| 5,886,383 | A | | 3/1999 | Kinzer |
| 5,925,910 | A | * | 7/1999 | Menegoli .................. 257/335 |
| 6,573,562 | B1 | | 6/2003 | Parthasarathy |

* cited by examiner

*Primary Examiner*—Hung Vu
(74) *Attorney, Agent, or Firm*—James L. Clingan, Jr.

(57) ABSTRACT

An LDMOS transistor has a Schottky diode inserted at the center of a doped region of the LDMOS transistor. A Typical LDMOS transistor has a drift region in the center. In this case a Schottky diode is inserted at the center of this drift region which has the effect of providing a Schottky diode connected from source to drain in the forward direction so that the drain voltage is clamped to a voltage that is lower than the PN junction threshold, thereby avoiding forward biasing the PN junction. An alternative is to insert the Schottky diode at the well in which the source is formed, which is on the periphery of the LDMOS transistor. In such case the Schottky diode is formed differently but still is connected from source to drain in the forward direction to achieve the desired voltage clamping at the drain.

10 Claims, 1 Drawing Sheet

LDMOS TRANSISTOR

FIELD OF THE INVENTION

This invention relates to LDMOS transistors, and more particularly, to LDMOS transistors that have protection against the application of a negative voltage to a current electrode.

RELATED ART

LDMOS transistors have many valuable uses relating to their higher breakdown voltages. In some of the applications the environment is electronically noisy, such as an automotive environment. One of the things that can happen is what is known as inductive kickback in which the rapid turning off of a current can cause the generation of a negative voltage due to the inductive characteristics of the circuit. This negative voltage can forward bias a PN junction and cause large amounts of current to flow. The forward biasing of a PN junction often is not in isolation and involves a parasitic bipolar transistor. Thus, the forward biasing has the effect of turning on this bipolar transistor and causing relatively large amounts of current to flow in areas that disturb logic and analog circuits. One technique to alleviate this is to provide a large guard ring around the LDMOS transistor that collects the forward bias current. This takes a very large amount of extra space. Other solutions tend to take large amounts of space as well.

Thus, there is a need to provide effective protection for LDMOS transistors against negative voltage noise occurrences while not excessively increasing the size of the LDMOS transistor.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, an LDMOS transistor has a Schottky diode inserted at the center of the device structure of the LDMOS transistor. A Typical LDMOS transistor has a drift region in the center. In this case a Schottky diode is inserted at the center of this drift region which has the effect of providing a Schottky diode connected from source to drain in the forward direction so that the drain voltage is clamped to a voltage that is lower than the PN junction threshold, thereby avoiding forward biasing the PN junction. An alternative is to insert the Schottky diode at the well in which the source is formed, which is on the periphery of the LDMOS transistor. In such case the Schottky diode is formed differently but still is connected from source to drain in the forward direction to achieve the desired voltage clamping at the drain. This is better understood by reference to the figures and the following description.

Figure 1:
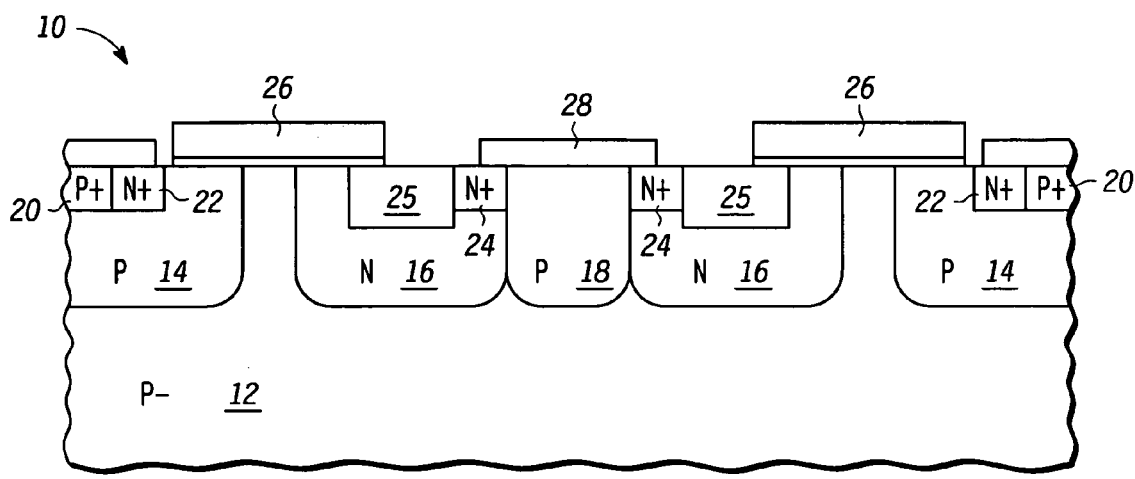
FIG. 1 is a cross section of an LDMOS transistor according to a first embodiment of the invention.

Shown in FIG. 1 is a device structure 10 useful as an LDMOS transistor comprising a substrate 12 that is P−, a region 14 doped to P, a region 16 spaced from region 14 doped to N and that functions as a drift region for the LDMOS transistor, a region 18 adjacent to region 16 doped to P, a region 20 doped to P+ in region 14, a region 22 doped to N+ adjacent to region 20 and in region 14, an isolation region 25 in region 16 that is formed of an insulating material such as oxide, a region 24 doped to N+ in region 16 and adjacent to isolation region 25, a silicide contact 27 of cobalt silicide over portions of regions 20 and 22, a gate 26 spaced from silicide contact 27, silicide terminal 28 which is a positive terminal of a Schottky diode 29 and is on region 18. In conventional LDMOS fashion, the regions surround the center, which in this case is region 18. Regions 14, 16, and 18 are formed in substrate 12. Regions 20 and 22 are formed in region 14. Isolation region 25 and region 24 are formed in region 16. Gate 26 is over a portion of region 14, the space between regions 14 and 16, a portion of region 16, and a portion of isolation region 25. Transistor 10 is one type of conventional LDMOS transistor but with the addition of Schottky diode 29 made up of silicide terminal 28 and region 16. Region 24 serves as both the drain contact and the guard ring for Schottky diode 29.

In a negative voltage situation at drain 24, Schottky diode 29 becomes forward biased at about −0.2 volt at drain 24 because substrate 12 is at ground through region 20, which is shorted to region 22, the source of transistor 27. This forward biasing causes a current flow from contact 27 through regions 20 and 14 and substrate 12 to region 18 and out through silicide 28. This current flowing at −0.2 volt prevents drain 24 from reaching a sufficiently negative value to forward bias the PN junction at the interface of region 16 and substrate 12. Substrate 12 is in contact with other N regions in other locations not shown. If that junction between region 16 and substrate 12 were forward biased that would have the effect of generating a base emitter current which would cause current flow from the other N regions contacting substrate 12.

Region 18 and silicide 28 are easily integrated into common processes for making an LDMOS transistor. At the formation of regions such as region 16, a mask blocks the N type implant from the area subsequently occupied by region 18. Regions 22 and 24 are formed by an implant in which the other regions are masked. Region 18 is formed by an implant in which the other regions are masked. P region 14 is more heavily doped than P region 18 so more than one implant step is required to form both of these regions 14 and 18. After formation of regions 16, 18, and 24, region 18 is silicided along with a portion of region 24 that is adjacent to region 18. The result is that Schottky diode 29 is surrounded by region 16 which functions as the drain for the LDMOS transistor. Region 24, which is in region 16 and functions as a drain contact for the LDMOS transistor, is much shallower than region 16 and also surrounds Schottky diode 29.

Figure 2:
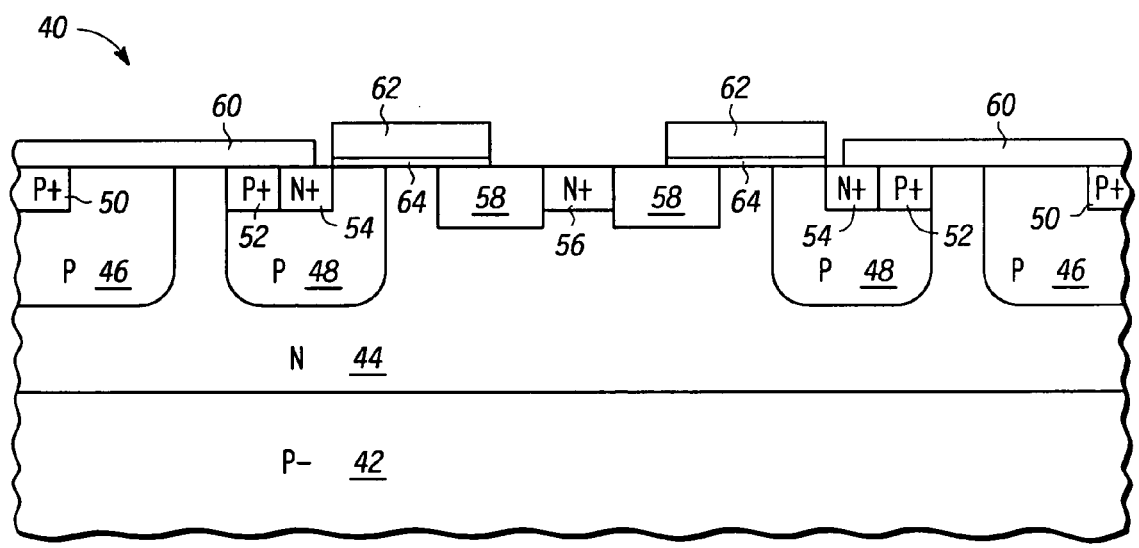
FIG. 2 is a cross section of an LDMOS transistor according to a second embodiment of the invention.

Shown in FIG. 2 is a device structure 40 useful as an LDMOS transistor comprising a substrate 42 that is P−, a region 44 that is doped to N type that functions as a drift region for the LDMOS transistor, a region 46 that is doped to P, a region 48 spaced from region 46 that is doped to P, an isolation region 58 formed of an insulating material such as oxide, a region 56 that is doped to N+ that functions as the drain contact, a region 50 that is doped to P+, a region 52 doped to P+, a region 54 adjacent to region 52 that is doped to N+, a silicide terminal 60 on the surface of substrate 42 that serves as a positive terminal of Schottky diode 65 formed from silicide terminal 60 and the portion of region 44 that is between regions 46 and 48, and a gate 62 spaced from silicide terminal 60 and separated from substrate 42 by a gate dielectric 64. Regions 46 and 48 are in region 44. Region 50 is in region 46. Regions 52 and 54 are in region 48. Regions 50 and 52 function as body contacts for the LDMOS transistor and are much shallower than regions 46 and 48 in which they reside, respectively. Region 54 functions as the source of the LDMOS transistor. Silicide terminal 60 is on region 50, a portion of region 46 adjacent to region 50, the space between regions 46 and 48, on region 52, and a portion of region 54. Silicide terminal 60, in addition to being a positive terminal for Schottky diode 65, shorts the source of the LDMOS transistor to region 52 which in turn operates as the body contact for a channel that is at the surface of substrate 42 in region 48 under gate 62. This is similar to device structure 10 in that it is another conventional LDMOS structure but with an added Schottky diode.

Regions 46 and 48 provide a partial pinchoff effect for Schottky diode 65 that improves its reverse bias leakage current. Further improvement in pinchoff would come from making regions 46 and 48 even deeper while keeping the boundaries of these regions very vertical. It is understood to one or ordinary skill in the art that in practice, that the LDMOS transistor shown in FIG. 2 and the LDMOS transistor shown in FIG. 1 are tied in parallel with many other structures that are the same as they are. This is done in order to achieve the final LDMOS transistor that can operate as a high voltage driver. In this case of device structure 40 of FIG. 2, region 46 is not necessary for achieving a bare functioning transistor but is useful in providing the final LDMOS transistor and is useful for aiding the performance of Schottky diode 65 that is integrated in device structure 40. Thus this region 46, in that sense, is part of the LDMOS transistor and in the sense of aiding the final LDMOS provides the same function as region 48 and could be considered the same region as 48 and together with region 48 substantially surround Schottky diode 65. But for the presence of Schottky diode 65 they would in fact be the same region. With the presence of Schottky diode 65, these regions are not continuous but they can be considered to be substantially so because they have the same transistor function, they are formed in the same way and at the same time, there is nothing of the same type between them so they are adjacent, and they are electrically connected. The result is that regions 46 and 48 function together as a substantially-continuous doped region that functions as the body for the LDMOS transistor and surrounds Schottky diode 65.

In a negative voltage situation at drain 56, Schottky diode 65 becomes forward biased at about −0.2 volt at drain 56 because silicide terminal 60 is at ground. This forward biasing causes a current flow from silicide terminal 60 to region 56 through region 44. This current flowing at −0.2 volt prevents the drain at region 56 from reaching a sufficiently negative value to forward bias the PN junction at the interface of region 44 and substrate 42. Substrate 42 is in contact with other N regions in other locations not shown. If that junction between region 44 and substrate 42 were forward biased that would have the effect of generating a base-emitter current which would cause current flow from the other N regions contacting substrate 42.

Added processing complexity is minimal. A drift implant is performed to form region 44 in substrate 42 as is well known. In the region where the LDMOS transistors are repeated, at regions 46 and 48, the space between these regions is masked when regions 46 and 48 are implanted. This space is also masked when regions 50, 52, 54, and 56 are formed. Regions are 50 and 52 are implanted at the same time. Regions 54 and 56 are implanted at the same time. With region 44 as the background, the space between regions 46 and 48 is effective as the negative terminal of Schottky diode 65. A silicide is formed in normal processing to short regions 52 and 54 and is performed on regions 52 and 54. It is a simple matter to simply extend this siliciding over the space between regions 46 and 48 to form the positive terminal of Schottky diode 65.

Thus, in two embodiments a Schottky diode is integrated as part of a LDMOS transistor to provide for protection of a negative voltage being applied to the drain of the LDMOS transistor.

In the foregoing specification, the invention has been described with reference to specific embodiments. However, one of ordinary skill in the art appreciates that various modifications and changes can be made without departing from the scope of the present invention as set forth in the claims below. For example, other semiconductor materials different from silicon may be used as the substrate. The various doped regions were described as being either P or N but these conductivity types may be reversible to achieve similar results. The metal used for the Schottky diodes may a different metal from cobalt silicide. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A device structure, comprising:
    a substrate having a semiconductor region;
    an LDMOS transistor structure in the semiconductor region having a substantially-continuous doped region for performing a transistor based function, the substantially-continuous doped region having a first doped region more heavily doped and shallower than the substantially-continuous doped region and of the same conductivity type as the substantially-continuous doped region and the substantially-continuous doped region functions as a drain; and
    a Schottky diode substantially surrounded by the substantially-continuous doped region.

2. A device structure, comprising:
    a substrate having a semiconductor region;
    an LDMOS transistor structure in the semiconductor region having a substantially-continuous doped region for peffomina a transistor based function, the substantially-continuous doped region having a first doped region more heavily doped and shallower than the substantially-continuous doped region and of the same conductivity type as the substantially-continuous doped region; and a Schottky diode substantially surrounded by the substantially-continuous doped region;

wherein the semiconductor region has a background doping of a first conductivity type and wherein the Schottky diode comprises:

a silicide region on the surface of the substrate; and a second doped region that is in the semiconductor region, in contact with the silicide region, of the first conductivity type, and of a higher concentration than the semiconductor region.

3. The device structure of claim 2, wherein the LDMOS transistor structure comprises:

an isolation region in the substantially-continuous doped region adjacent to the first doped region and spaced from an edge of the substantially-continuous doped region;

a third doped region of the same conductivity type as the semiconductor region spaced from the substantially continuous doped region so that there is a space between the third doped region and the substantially continuous doped region; and a gate structure overlying a portion of the third doped region, the space, a portion of the substantially-continuous doped region, and a portion of the isolation region.

4. The device structure of claim 3, wherein the conductivity type of the semiconductor region is P type.

5. The device structure of claim 3, wherein the third doped region is further characterized as having a fourth doped region of the first conductivity type having a higher doping concentration than the semiconductor region as a source contact.

6. The device structure of claim 5, wherein the third doped region is further characterized as having a fifth doped region spaced from the space and between the space and the fourth doped region.

7. A device structure comprising a transistor and a Schottky diode further characterized as having:

a substrate having a semiconductor region;

a gate structure of the transistor overlying the semiconductor region;

a first doped region at the surface of the semiconductor region of a first conductivity type formed in and at the surface of the semiconductor region, wherein a portion of the first doped region is under a portion of the gate structure and the first doped region includes a drain contact for the transistor;

a first Schottky terminal comprising a Schottky region in and at the surface of the semiconductor region that is adjacent with the first doped region; and a second Schottky terminal comprising a metal on the Schottky region.

8. The device structure of claim 7, wherein the Schottky region is contiguous with the first doped region.

9. The device structure of claim 8, wherein the first doped region is further characterized as having an isolation region having a portion under the gate structure.

10. The device structure of claim 7, further characterized as having a second doped region of the second conductivity type spaced from the first doped region, wherein a portion of the second doped region is under the gate structure.

* * * * *